United States Patent
Zeng et al.

(10) Patent No.: US 9,104,107 B1
(45) Date of Patent: Aug. 11, 2015

(54) DUV PHOTORESIST PROCESS

(71) Applicant: Western Digital (Fremont), LLC, Fremont, CA (US)

(72) Inventors: Xianzhong Zeng, Fremont, CA (US); Hai Sun, Milpitas, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 65 days.

(21) Appl. No.: 13/905,123

(22) Filed: May 29, 2013

Related U.S. Application Data

(60) Provisional application No. 61/808,160, filed on Apr. 3, 2013.

(51) Int. Cl.
  *G03F 7/20* (2006.01)

(52) U.S. Cl.
  CPC ............... *G03F 7/20* (2013.01); *G03F 7/2004* (2013.01)

(58) Field of Classification Search
  CPC ............ G03F 7/20; G03F 7/2004; G03F 7/38
  USPC .......................................... 430/311, 322, 330
  See application file for complete search history.

(56) References Cited

U.S. PATENT DOCUMENTS

| | | | |
|---|---|---|---|
| 4,748,053 A | 5/1988 | Okada | |
| 4,806,453 A | 2/1989 | Vidusek et al. | |
| 5,219,713 A | 6/1993 | Robinson | |
| 5,395,649 A | 3/1995 | Ikeda | |
| 5,405,813 A | 4/1995 | Rodrigues | |
| 5,472,502 A | 12/1995 | Batchelder | |
| 5,773,082 A | 6/1998 | Ku et al. | |
| 5,780,105 A | 7/1998 | Wang | |
| 5,802,700 A | 9/1998 | Chen et al. | |
| 5,863,709 A * | 1/1999 | Nakagawa et al. | 430/326 |
| 5,985,363 A | 11/1999 | Shiau et al. | |
| 5,985,364 A | 11/1999 | Smith et al. | |
| 5,989,632 A | 11/1999 | Sanada et al. | |
| 6,016,290 A | 1/2000 | Chen et al. | |
| 6,018,441 A | 1/2000 | Wu et al. | |
| 6,025,978 A | 2/2000 | Hoshi et al. | |
| 6,025,988 A | 2/2000 | Yan | |
| 6,032,353 A | 3/2000 | Hiner et al. | |
| 6,033,532 A | 3/2000 | Minami | |
| 6,034,851 A | 3/2000 | Zarouri et al. | |
| 6,043,959 A | 3/2000 | Crue et al. | |
| 6,046,885 A | 4/2000 | Aimonetti et al. | |
| 6,049,650 A | 4/2000 | Jerman et al. | |
| 6,055,138 A | 4/2000 | Shi | |
| 6,058,094 A | 5/2000 | Davis et al. | |

(Continued)

FOREIGN PATENT DOCUMENTS

EP  0219626 A2  4/1987

OTHER PUBLICATIONS

Shin-Etsu MicroSi, "ArF Photoresist SAIL-Series: Superior PEB Temperature Margin," http://www.microsi.com/user/document/Deep_UV_ArF_Sail.pdf, downloaded on Oct. 27, 2014, pp. 1-2.

(Continued)

*Primary Examiner* — Kathleen Duda

(57) ABSTRACT

DUV lithography process that eliminates post exposure baking of a photoresist. Thick photoresist may be processed to obtain enhanced sidewall profiles for microelectronic devices.

18 Claims, 3 Drawing Sheets

(56) References Cited

U.S. PATENT DOCUMENTS

| | | |
|---|---|---|
| 6,073,338 A | 6/2000 | Liu et al. |
| 6,078,479 A | 6/2000 | Nepela et al. |
| 6,081,499 A | 6/2000 | Berger et al. |
| 6,094,803 A | 8/2000 | Carlson et al. |
| 6,099,362 A | 8/2000 | Viches et al. |
| 6,103,073 A | 8/2000 | Thayamballi |
| 6,108,166 A | 8/2000 | Lederman |
| 6,117,486 A | 9/2000 | Yoshihara |
| 6,118,629 A | 9/2000 | Huai et al. |
| 6,118,638 A | 9/2000 | Knapp et al. |
| 6,125,018 A | 9/2000 | Takagishi et al. |
| 6,130,779 A | 10/2000 | Carlson et al. |
| 6,130,809 A | 10/2000 | Santini |
| 6,134,089 A | 10/2000 | Barr et al. |
| 6,136,166 A | 10/2000 | Shen et al. |
| 6,137,661 A | 10/2000 | Shi et al. |
| 6,137,662 A | 10/2000 | Huai et al. |
| 6,160,684 A | 12/2000 | Heist et al. |
| 6,163,426 A | 12/2000 | Nepela et al. |
| 6,166,891 A | 12/2000 | Lederman et al. |
| 6,173,486 B1 | 1/2001 | Hsiao et al. |
| 6,175,476 B1 | 1/2001 | Huai et al. |
| 6,178,066 B1 | 1/2001 | Barr |
| 6,178,070 B1 | 1/2001 | Hong et al. |
| 6,178,150 B1 | 1/2001 | Davis |
| 6,181,485 B1 | 1/2001 | He |
| 6,181,525 B1 | 1/2001 | Carlson |
| 6,185,051 B1 | 2/2001 | Chen et al. |
| 6,185,077 B1 | 2/2001 | Tong et al. |
| 6,185,081 B1 | 2/2001 | Simion et al. |
| 6,188,549 B1 | 2/2001 | Wiitala |
| 6,190,764 B1 | 2/2001 | Shi et al. |
| 6,193,584 B1 | 2/2001 | Rudy et al. |
| 6,195,229 B1 | 2/2001 | Shen et al. |
| 6,198,608 B1 | 3/2001 | Hong et al. |
| 6,198,609 B1 | 3/2001 | Barr et al. |
| 6,201,673 B1 | 3/2001 | Rottmayer et al. |
| 6,204,998 B1 | 3/2001 | Katz |
| 6,204,999 B1 | 3/2001 | Crue et al. |
| 6,212,153 B1 | 4/2001 | Chen et al. |
| 6,215,625 B1 | 4/2001 | Carlson |
| 6,219,205 B1 | 4/2001 | Yuan et al. |
| 6,221,218 B1 | 4/2001 | Shi et al. |
| 6,222,707 B1 | 4/2001 | Huai et al. |
| 6,229,782 B1 | 5/2001 | Wang et al. |
| 6,230,959 B1 | 5/2001 | Heist et al. |
| 6,233,116 B1 | 5/2001 | Chen et al. |
| 6,233,125 B1 | 5/2001 | Knapp et al. |
| 6,237,215 B1 | 5/2001 | Hunsaker et al. |
| 6,252,743 B1 | 6/2001 | Bozorgi |
| 6,255,721 B1 | 7/2001 | Roberts |
| 6,258,468 B1 | 7/2001 | Mahvan et al. |
| 6,266,216 B1 | 7/2001 | Hikami et al. |
| 6,271,604 B1 | 8/2001 | Frank, Jr. et al. |
| 6,275,354 B1 | 8/2001 | Huai et al. |
| 6,277,505 B1 | 8/2001 | Shi et al. |
| 6,282,056 B1 | 8/2001 | Feng et al. |
| 6,296,955 B1 | 10/2001 | Hossain et al. |
| 6,297,955 B1 | 10/2001 | Frank, Jr. et al. |
| 6,304,414 B1 | 10/2001 | Crue, Jr. et al. |
| 6,307,715 B1 | 10/2001 | Berding et al. |
| 6,310,746 B1 | 10/2001 | Hawwa et al. |
| 6,310,750 B1 | 10/2001 | Hawwa et al. |
| 6,317,290 B1 | 11/2001 | Wang et al. |
| 6,317,297 B1 | 11/2001 | Tong et al. |
| 6,322,911 B1 | 11/2001 | Fukagawa et al. |
| 6,330,136 B1 | 12/2001 | Wang et al. |
| 6,330,137 B1 | 12/2001 | Knapp et al. |
| 6,333,830 B2 | 12/2001 | Rose et al. |
| 6,340,533 B1 | 1/2002 | Ueno et al. |
| 6,349,014 B1 | 2/2002 | Crue, Jr. et al. |
| 6,351,355 B1 | 2/2002 | Min et al. |
| 6,353,318 B1 | 3/2002 | Sin et al. |
| 6,353,511 B1 | 3/2002 | Shi et al. |
| 6,356,412 B1 | 3/2002 | Levi et al. |
| 6,359,779 B1 | 3/2002 | Frank, Jr. et al. |
| 6,369,983 B1 | 4/2002 | Hong |
| 6,376,964 B1 | 4/2002 | Young et al. |
| 6,377,535 B1 | 4/2002 | Chen et al. |
| 6,381,095 B1 | 4/2002 | Sin et al. |
| 6,381,105 B1 | 4/2002 | Huai et al. |
| 6,387,825 B2 | 5/2002 | You et al. |
| 6,389,499 B1 | 5/2002 | Frank, Jr. et al. |
| 6,392,850 B1 | 5/2002 | Tong et al. |
| 6,396,660 B1 | 5/2002 | Jensen et al. |
| 6,399,179 B1 | 6/2002 | Hanrahan et al. |
| 6,400,526 B2 | 6/2002 | Crue, Jr. et al. |
| 6,404,600 B1 | 6/2002 | Hawwa et al. |
| 6,404,601 B1 | 6/2002 | Rottmayer et al. |
| 6,404,706 B1 | 6/2002 | Stovall et al. |
| 6,407,009 B1 | 6/2002 | You et al. |
| 6,410,170 B1 | 6/2002 | Chen et al. |
| 6,411,522 B1 | 6/2002 | Frank, Jr. et al. |
| 6,417,998 B1 | 7/2002 | Crue, Jr. et al. |
| 6,417,999 B1 | 7/2002 | Knapp et al. |
| 6,418,000 B1 | 7/2002 | Gibbons et al. |
| 6,418,048 B1 | 7/2002 | Sin et al. |
| 6,420,098 B1 | 7/2002 | Mautz |
| 6,421,211 B1 | 7/2002 | Hawwa et al. |
| 6,421,212 B1 | 7/2002 | Gibbons et al. |
| 6,424,505 B1 | 7/2002 | Lam et al. |
| 6,424,507 B1 | 7/2002 | Lederman et al. |
| 6,430,009 B1 | 8/2002 | Komaki et al. |
| 6,430,806 B1 | 8/2002 | Chen et al. |
| 6,433,965 B1 | 8/2002 | Gopinathan et al. |
| 6,433,968 B1 | 8/2002 | Shi et al. |
| 6,433,970 B1 | 8/2002 | Knapp et al. |
| 6,437,945 B1 | 8/2002 | Hawwa et al. |
| 6,445,536 B1 | 9/2002 | Rudy et al. |
| 6,445,542 B1 | 9/2002 | Levi et al. |
| 6,445,553 B2 | 9/2002 | Barr et al. |
| 6,445,554 B1 | 9/2002 | Dong et al. |
| 6,447,935 B1 | 9/2002 | Zhang et al. |
| 6,448,765 B1 | 9/2002 | Chen et al. |
| 6,451,514 B1 | 9/2002 | Iitsuka |
| 6,452,742 B1 | 9/2002 | Crue et al. |
| 6,452,765 B1 | 9/2002 | Mahvan et al. |
| 6,456,465 B1 | 9/2002 | Louis et al. |
| 6,459,552 B1 | 10/2002 | Liu et al. |
| 6,462,920 B1 | 10/2002 | Karimi |
| 6,466,401 B1 | 10/2002 | Hong et al. |
| 6,466,402 B1 | 10/2002 | Crue, Jr. et al. |
| 6,466,404 B1 | 10/2002 | Crue, Jr. et al. |
| 6,468,436 B1 | 10/2002 | Shi et al. |
| 6,469,877 B1 | 10/2002 | Knapp et al. |
| 6,477,019 B2 | 11/2002 | Matono et al. |
| 6,479,096 B1 | 11/2002 | Shi et al. |
| 6,483,662 B1 | 11/2002 | Thomas et al. |
| 6,487,040 B1 | 11/2002 | Hsiao et al. |
| 6,487,056 B1 | 11/2002 | Gibbons et al. |
| 6,490,125 B1 | 12/2002 | Barr |
| 6,496,330 B1 | 12/2002 | Crue, Jr. et al. |
| 6,496,334 B1 | 12/2002 | Pang et al. |
| 6,504,676 B1 | 1/2003 | Hiner et al. |
| 6,512,657 B2 | 1/2003 | Heist et al. |
| 6,512,659 B1 | 1/2003 | Hawwa et al. |
| 6,512,661 B1 | 1/2003 | Louis |
| 6,512,690 B1 | 1/2003 | Qi et al. |
| 6,515,573 B1 | 2/2003 | Dong et al. |
| 6,515,791 B1 | 2/2003 | Hawwa et al. |
| 6,532,823 B1 | 3/2003 | Knapp et al. |
| 6,535,363 B1 | 3/2003 | Hosomi et al. |
| 6,552,874 B1 | 4/2003 | Chen et al. |
| 6,552,928 B1 | 4/2003 | Qi et al. |
| 6,577,470 B1 | 6/2003 | Rumpler |
| 6,582,889 B1 | 6/2003 | Kamijima |
| 6,583,961 B2 | 6/2003 | Levi et al. |
| 6,583,968 B1 | 6/2003 | Scura et al. |
| 6,597,548 B1 | 7/2003 | Yamanaka et al. |
| 6,611,398 B1 | 8/2003 | Rumpler et al. |
| 6,618,223 B1 | 9/2003 | Chen et al. |
| 6,629,357 B1 | 10/2003 | Akoh |
| 6,633,464 B2 | 10/2003 | Lai et al. |
| 6,636,394 B1 | 10/2003 | Fukagawa et al. |

(56) References Cited

U.S. PATENT DOCUMENTS

| | | |
|---|---|---|
| 6,639,291 B1 | 10/2003 | Sin et al. |
| 6,650,503 B1 | 11/2003 | Chen et al. |
| 6,650,506 B1 | 11/2003 | Risse |
| 6,654,195 B1 | 11/2003 | Frank, Jr. et al. |
| 6,657,816 B1 | 12/2003 | Barr et al. |
| 6,661,621 B1 | 12/2003 | Iitsuka |
| 6,661,625 B1 | 12/2003 | Sin et al. |
| 6,674,610 B1 | 1/2004 | Thomas et al. |
| 6,680,863 B1 | 1/2004 | Shi et al. |
| 6,683,763 B1 | 1/2004 | Hiner et al. |
| 6,687,098 B1 | 2/2004 | Huai |
| 6,687,178 B1 | 2/2004 | Qi et al. |
| 6,687,977 B2 | 2/2004 | Knapp et al. |
| 6,691,226 B1 | 2/2004 | Frank, Jr. et al. |
| 6,697,294 B1 | 2/2004 | Qi et al. |
| 6,700,738 B1 | 3/2004 | Sin et al. |
| 6,700,759 B1 | 3/2004 | Knapp et al. |
| 6,704,158 B2 | 3/2004 | Hawwa et al. |
| 6,707,083 B1 | 3/2004 | Hiner et al. |
| 6,713,801 B1 | 3/2004 | Sin et al. |
| 6,721,138 B1 | 4/2004 | Chen et al. |
| 6,721,149 B1 | 4/2004 | Shi et al. |
| 6,721,203 B1 | 4/2004 | Qi et al. |
| 6,724,569 B1 | 4/2004 | Chen et al. |
| 6,724,572 B1 | 4/2004 | Stoev et al. |
| 6,729,015 B2 | 5/2004 | Matono et al. |
| 6,735,850 B1 | 5/2004 | Gibbons et al. |
| 6,737,281 B1 | 5/2004 | Dang et al. |
| 6,744,608 B1 | 6/2004 | Sin et al. |
| 6,747,301 B1 | 6/2004 | Hiner et al. |
| 6,751,055 B1 | 6/2004 | Alfoqaha et al. |
| 6,754,049 B1 | 6/2004 | Seagle et al. |
| 6,756,071 B1 | 6/2004 | Shi et al. |
| 6,757,140 B1 | 6/2004 | Hawwa |
| 6,760,196 B1 | 7/2004 | Niu et al. |
| 6,762,910 B1 | 7/2004 | Knapp et al. |
| 6,765,756 B1 | 7/2004 | Hong et al. |
| 6,775,902 B1 | 8/2004 | Huai et al. |
| 6,778,358 B1 | 8/2004 | Jiang et al. |
| 6,781,927 B1 | 8/2004 | Heanuc et al. |
| 6,785,955 B1 | 9/2004 | Chen et al. |
| 6,791,793 B1 | 9/2004 | Chen et al. |
| 6,791,807 B1 | 9/2004 | Hikami et al. |
| 6,797,456 B1 | 9/2004 | Gu et al. |
| 6,798,616 B1 | 9/2004 | Seagle et al. |
| 6,798,625 B1 | 9/2004 | Ueno et al. |
| 6,801,408 B1 | 10/2004 | Chen et al. |
| 6,801,411 B1 | 10/2004 | Lederman et al. |
| 6,803,615 B1 | 10/2004 | Sin et al. |
| 6,806,035 B1 | 10/2004 | Atireklapvarodom et al. |
| 6,807,030 B1 | 10/2004 | Hawwa et al. |
| 6,807,332 B1 | 10/2004 | Hawwa |
| 6,809,899 B1 | 10/2004 | Chen et al. |
| 6,816,345 B1 | 11/2004 | Knapp et al. |
| 6,828,897 B1 | 12/2004 | Nepela |
| 6,829,160 B1 | 12/2004 | Qi et al. |
| 6,829,819 B1 | 12/2004 | Crue, Jr. et al. |
| 6,833,979 B1 | 12/2004 | Knapp et al. |
| 6,834,010 B1 | 12/2004 | Qi et al. |
| 6,849,563 B2 | 2/2005 | Barth et al. |
| 6,859,343 B1 | 2/2005 | Alfoqaha et al. |
| 6,859,997 B1 | 3/2005 | Tong et al. |
| 6,861,937 B1 | 3/2005 | Feng et al. |
| 6,870,712 B2 | 3/2005 | Chen et al. |
| 6,873,494 B2 | 3/2005 | Chen et al. |
| 6,873,547 B1 | 3/2005 | Shi et al. |
| 6,878,508 B2 | 4/2005 | Watanabe et al. |
| 6,879,464 B2 | 4/2005 | Sun et al. |
| 6,888,184 B1 | 5/2005 | Shi et al. |
| 6,888,704 B1 | 5/2005 | Diao et al. |
| 6,890,595 B2 | 5/2005 | Lee et al. |
| 6,891,702 B1 | 5/2005 | Tang |
| 6,894,871 B2 | 5/2005 | Alfoqaha et al. |
| 6,894,877 B1 | 5/2005 | Crue, Jr. et al. |
| 6,906,894 B2 | 6/2005 | Chen et al. |
| 6,909,578 B1 | 6/2005 | Missell et al. |
| 6,912,106 B1 | 6/2005 | Chen et al. |
| 6,934,113 B1 | 8/2005 | Chen |
| 6,934,129 B1 | 8/2005 | Zhang et al. |
| 6,940,688 B2 | 9/2005 | Jiang et al. |
| 6,942,824 B1 | 9/2005 | Li |
| 6,943,993 B2 | 9/2005 | Chang et al. |
| 6,944,938 B1 | 9/2005 | Crue, Jr. et al. |
| 6,947,258 B1 | 9/2005 | Li |
| 6,950,266 B1 | 9/2005 | McCaslin et al. |
| 6,954,332 B1 | 10/2005 | Hong et al. |
| 6,958,885 B1 | 10/2005 | Chen et al. |
| 6,960,540 B2 | 11/2005 | Ito et al. |
| 6,961,221 B1 | 11/2005 | Niu et al. |
| 6,969,989 B1 | 11/2005 | Mei |
| 6,975,486 B2 | 12/2005 | Chen et al. |
| 6,987,643 B1 | 1/2006 | Seagle |
| 6,989,962 B1 | 1/2006 | Dong et al. |
| 6,989,972 B1 | 1/2006 | Stoev et al. |
| 7,006,327 B2 | 2/2006 | Krounbi et al. |
| 7,007,372 B1 | 3/2006 | Chen et al. |
| 7,012,832 B1 | 3/2006 | Sin et al. |
| 7,023,658 B1 | 4/2006 | Knapp et al. |
| 7,026,063 B2 | 4/2006 | Ueno et al. |
| 7,027,268 B1 | 4/2006 | Zhu et al. |
| 7,027,274 B1 | 4/2006 | Sin et al. |
| 7,035,046 B1 | 4/2006 | Young et al. |
| 7,041,985 B1 | 5/2006 | Wang et al. |
| 7,046,490 B1 | 5/2006 | Ueno et al. |
| 7,054,113 B1 | 5/2006 | Seagle et al. |
| 7,057,857 B1 | 6/2006 | Niu et al. |
| 7,059,868 B1 | 6/2006 | Yan |
| 7,071,124 B1 | 7/2006 | Kallingal et al. |
| 7,092,195 B1 | 8/2006 | Liu et al. |
| 7,094,924 B2 | 8/2006 | Nitta et al. |
| 7,110,289 B1 | 9/2006 | Sin et al. |
| 7,111,382 B1 | 9/2006 | Knapp et al. |
| 7,113,366 B1 | 9/2006 | Wang et al. |
| 7,114,241 B2 | 10/2006 | Kubota et al. |
| 7,116,517 B1 | 10/2006 | He et al. |
| 7,124,654 B1 | 10/2006 | Davies et al. |
| 7,126,788 B1 | 10/2006 | Liu et al. |
| 7,126,790 B1 | 10/2006 | Liu et al. |
| 7,131,346 B1 | 11/2006 | Buttar et al. |
| 7,133,253 B1 | 11/2006 | Seagle et al. |
| 7,134,185 B1 | 11/2006 | Knapp et al. |
| 7,154,715 B2 | 12/2006 | Yamanaka et al. |
| 7,170,725 B1 | 1/2007 | Zhou et al. |
| 7,177,117 B1 | 2/2007 | Jiang et al. |
| 7,193,815 B1 | 3/2007 | Stoev et al. |
| 7,196,880 B1 | 3/2007 | Anderson et al. |
| 7,199,974 B1 | 4/2007 | Alfoqaha |
| 7,199,975 B1 | 4/2007 | Pan |
| 7,211,339 B1 | 5/2007 | Seagle et al. |
| 7,212,384 B1 | 5/2007 | Stoev et al. |
| 7,238,292 B1 | 7/2007 | He et al. |
| 7,239,478 B1 | 7/2007 | Sin et al. |
| 7,248,431 B1 | 7/2007 | Liu et al. |
| 7,248,433 B1 | 7/2007 | Stoev et al. |
| 7,248,449 B1 | 7/2007 | Seagle |
| 7,280,325 B1 | 10/2007 | Pan |
| 7,283,327 B1 | 10/2007 | Liu et al. |
| 7,284,316 B1 | 10/2007 | Huai et al. |
| 7,286,329 B1 | 10/2007 | Chen et al. |
| 7,289,303 B1 | 10/2007 | Sin et al. |
| 7,292,409 B1 | 11/2007 | Stoev et al. |
| 7,296,339 B1 | 11/2007 | Yang et al. |
| 7,307,814 B1 | 12/2007 | Seagle et al. |
| 7,307,818 B1 | 12/2007 | Park et al. |
| 7,310,204 B1 | 12/2007 | Stoev et al. |
| 7,318,947 B1 | 1/2008 | Park et al. |
| 7,333,295 B1 | 2/2008 | Medina et al. |
| 7,337,530 B1 | 3/2008 | Stoev et al. |
| 7,342,752 B1 | 3/2008 | Zhang et al. |
| 7,349,170 B1 | 3/2008 | Rudman et al. |
| 7,349,179 B1 | 3/2008 | He et al. |
| 7,354,664 B1 | 4/2008 | Jiang et al. |
| 7,363,697 B1 | 4/2008 | Dunn et al. |
| 7,371,152 B1 | 5/2008 | Newman |

(56) References Cited

U.S. PATENT DOCUMENTS

| | | |
|---|---|---|
| 7,372,665 B1 | 5/2008 | Stoev et al. |
| 7,375,926 B1 | 5/2008 | Stoev et al. |
| 7,379,269 B1 | 5/2008 | Krounbi et al. |
| 7,386,933 B1 | 6/2008 | Krounbi et al. |
| 7,389,577 B1 | 6/2008 | Shang et al. |
| 7,396,482 B2 | 7/2008 | Brandl |
| 7,417,832 B1 | 8/2008 | Erickson et al. |
| 7,419,891 B1 | 9/2008 | Chen et al. |
| 7,428,124 B1 | 9/2008 | Song et al. |
| 7,430,098 B1 | 9/2008 | Song et al. |
| 7,436,620 B1 | 10/2008 | Kang et al. |
| 7,436,638 B1 | 10/2008 | Pan |
| 7,440,220 B1 | 10/2008 | Kang et al. |
| 7,443,632 B1 | 10/2008 | Stoev et al. |
| 7,444,740 B1 | 11/2008 | Chung et al. |
| 7,493,688 B1 | 2/2009 | Wang et al. |
| 7,508,627 B1 | 3/2009 | Zhang et al. |
| 7,522,377 B1 | 4/2009 | Jiang et al. |
| 7,522,379 B1 | 4/2009 | Krounbi et al. |
| 7,522,382 B1 | 4/2009 | Pan |
| 7,542,246 B1 | 6/2009 | Song et al. |
| 7,551,406 B1 | 6/2009 | Thomas et al. |
| 7,552,523 B1 | 6/2009 | He et al. |
| 7,554,767 B1 | 6/2009 | Hu et al. |
| 7,583,466 B2 | 9/2009 | Kermiche et al. |
| 7,595,967 B1 | 9/2009 | Moon et al. |
| 7,639,457 B1 | 12/2009 | Chen et al. |
| 7,651,829 B2 | 1/2010 | Hamada et al. |
| 7,660,080 B1 | 2/2010 | Liu et al. |
| 7,672,080 B1 | 3/2010 | Tang et al. |
| 7,672,086 B1 | 3/2010 | Jiang |
| 7,684,160 B1 | 3/2010 | Erickson et al. |
| 7,688,546 B1 | 3/2010 | Bai et al. |
| 7,691,434 B1 | 4/2010 | Zhang et al. |
| 7,695,761 B1 | 4/2010 | Shen et al. |
| 7,719,795 B2 | 5/2010 | Hu et al. |
| 7,726,009 B1 | 6/2010 | Liu et al. |
| 7,729,086 B1 | 6/2010 | Song et al. |
| 7,729,087 B1 | 6/2010 | Stoev et al. |
| 7,736,823 B1 | 6/2010 | Wang et al. |
| 7,785,666 B1 | 8/2010 | Sun et al. |
| 7,796,356 B1 | 9/2010 | Fowler et al. |
| 7,800,858 B1 | 9/2010 | Bajikar et al. |
| 7,819,979 B1 | 10/2010 | Chen et al. |
| 7,829,264 B1 | 11/2010 | Wang et al. |
| 7,846,643 B1 | 12/2010 | Sun et al. |
| 7,855,854 B2 | 12/2010 | Hu et al. |
| 7,869,160 B1 | 1/2011 | Pan et al. |
| 7,872,824 B1 | 1/2011 | Macchioni et al. |
| 7,872,833 B2 | 1/2011 | Hu et al. |
| 7,910,267 B1 | 3/2011 | Zeng et al. |
| 7,911,735 B1 | 3/2011 | Sin et al. |
| 7,911,737 B1 | 3/2011 | Jiang et al. |
| 7,916,426 B2 | 3/2011 | Hu et al. |
| 7,918,013 B1 | 4/2011 | Dunn et al. |
| 7,968,219 B1 | 6/2011 | Jiang et al. |
| 7,977,019 B2 | 7/2011 | Murakami |
| 7,982,989 B1 | 7/2011 | Shi et al. |
| 8,008,912 B1 | 8/2011 | Shang |
| 8,012,804 B1 | 9/2011 | Wang et al. |
| 8,015,692 B1 | 9/2011 | Zhang et al. |
| 8,017,303 B2 | 9/2011 | Goldfarb et al. |
| 8,018,677 B1 | 9/2011 | Chung et al. |
| 8,018,678 B1 | 9/2011 | Zhang et al. |
| 8,024,748 B1 | 9/2011 | Moravec et al. |
| 8,072,705 B1 | 12/2011 | Wang et al. |
| 8,074,345 B1 | 12/2011 | Anguelouch et al. |
| 8,077,418 B1 | 12/2011 | Hu et al. |
| 8,077,434 B1 | 12/2011 | Shen et al. |
| 8,077,435 B1 | 12/2011 | Liu et al. |
| 8,077,557 B1 | 12/2011 | Hu et al. |
| 8,079,135 B1 | 12/2011 | Shen et al. |
| 8,081,403 B1 | 12/2011 | Chen et al. |
| 8,091,210 B1 | 1/2012 | Sasaki et al. |
| 8,097,846 B1 | 1/2012 | Anguelouch et al. |
| 8,104,166 B1 | 1/2012 | Zhang et al. |
| 8,116,043 B2 | 2/2012 | Leng et al. |
| 8,116,171 B1 | 2/2012 | Lee |
| 8,125,856 B1 | 2/2012 | Li et al. |
| 8,134,794 B1 | 3/2012 | Wang |
| 8,136,224 B1 | 3/2012 | Sun et al. |
| 8,136,225 B1 | 3/2012 | Zhang et al. |
| 8,136,805 B1 | 3/2012 | Lee |
| 8,141,235 B1 | 3/2012 | Zhang |
| 8,146,236 B1 | 4/2012 | Luo et al. |
| 8,149,536 B1 | 4/2012 | Yang et al. |
| 8,151,441 B1 | 4/2012 | Rudy et al. |
| 8,163,185 B1 | 4/2012 | Sun et al. |
| 8,164,760 B2 | 4/2012 | Willis |
| 8,164,855 B1 | 4/2012 | Gibbons et al. |
| 8,164,864 B2 | 4/2012 | Kaiser et al. |
| 8,165,709 B1 | 4/2012 | Rudy |
| 8,166,631 B1 | 5/2012 | Tran et al. |
| 8,166,632 B1 | 5/2012 | Zhang et al. |
| 8,169,473 B1 | 5/2012 | Yu et al. |
| 8,171,618 B1 | 5/2012 | Wang et al. |
| 8,179,636 B1 | 5/2012 | Bai et al. |
| 8,191,237 B1 | 6/2012 | Luo et al. |
| 8,194,365 B1 | 6/2012 | Leng et al. |
| 8,194,366 B1 | 6/2012 | Li et al. |
| 8,196,285 B1 | 6/2012 | Zhang et al. |
| 8,200,054 B1 | 6/2012 | Li et al. |
| 8,203,800 B2 | 6/2012 | Li et al. |
| 8,208,350 B1 | 6/2012 | Hu et al. |
| 8,220,140 B1 | 7/2012 | Wang et al. |
| 8,222,599 B1 | 7/2012 | Chien |
| 8,225,488 B1 | 7/2012 | Zhang et al. |
| 8,227,023 B1 | 7/2012 | Liu et al. |
| 8,228,633 B1 | 7/2012 | Tran et al. |
| 8,231,796 B1 | 7/2012 | Li et al. |
| 8,233,248 B1 | 7/2012 | Li et al. |
| 8,248,896 B1 | 8/2012 | Yuan et al. |
| 8,254,060 B1 | 8/2012 | Shi et al. |
| 8,257,597 B1 | 9/2012 | Guan et al. |
| 8,259,410 B1 | 9/2012 | Bai et al. |
| 8,259,539 B1 | 9/2012 | Hu et al. |
| 8,262,918 B1 | 9/2012 | Li et al. |
| 8,262,919 B1 | 9/2012 | Luo et al. |
| 8,264,797 B2 | 9/2012 | Emley |
| 8,264,798 B1 | 9/2012 | Guan et al. |
| 8,270,126 B1 | 9/2012 | Roy et al. |
| 8,276,258 B1 | 10/2012 | Tran et al. |
| 8,277,669 B1 | 10/2012 | Chen et al. |
| 8,279,719 B1 | 10/2012 | Hu et al. |
| 8,284,517 B1 | 10/2012 | Sun et al. |
| 8,288,204 B1 | 10/2012 | Wang et al. |
| 8,289,821 B1 | 10/2012 | Huber |
| 8,291,743 B1 | 10/2012 | Shi et al. |
| 8,307,539 B1 | 11/2012 | Rudy et al. |
| 8,307,540 B1 | 11/2012 | Tran et al. |
| 8,308,921 B1 | 11/2012 | Hiner et al. |
| 8,310,785 B1 | 11/2012 | Zhang et al. |
| 8,310,901 B1 | 11/2012 | Batra et al. |
| 8,315,019 B1 | 11/2012 | Mao et al. |
| 8,316,527 B2 | 11/2012 | Hong et al. |
| 8,320,076 B1 | 11/2012 | Shen et al. |
| 8,320,077 B1 | 11/2012 | Tang et al. |
| 8,320,219 B1 | 11/2012 | Wolf et al. |
| 8,320,220 B1 | 11/2012 | Yuan et al. |
| 8,320,722 B1 | 11/2012 | Yuan et al. |
| 8,322,022 B1 | 12/2012 | Yi et al. |
| 8,322,023 B1 | 12/2012 | Zeng et al. |
| 8,325,569 B1 | 12/2012 | Shi et al. |
| 8,333,008 B1 | 12/2012 | Sin et al. |
| 8,334,093 B2 | 12/2012 | Zhang et al. |
| 8,336,194 B2 | 12/2012 | Yuan et al. |
| 8,339,738 B1 | 12/2012 | Tran et al. |
| 8,341,826 B1 | 1/2013 | Jiang et al. |
| 8,343,319 B1 | 1/2013 | Li et al. |
| 8,343,364 B1 | 1/2013 | Gao et al. |
| 8,349,195 B1 | 1/2013 | Si et al. |
| 8,351,307 B1 | 1/2013 | Wolf et al. |
| 8,357,244 B1 | 1/2013 | Zhao et al. |
| 8,373,945 B1 | 2/2013 | Luo et al. |

(56) References Cited

U.S. PATENT DOCUMENTS

| | | |
|---|---|---|
| 8,375,564 B1 | 2/2013 | Luo et al. |
| 8,375,565 B2 | 2/2013 | Hu et al. |
| 8,381,391 B2 | 2/2013 | Park et al. |
| 8,385,157 B1 | 2/2013 | Champion et al. |
| 8,385,158 B1 | 2/2013 | Hu et al. |
| 8,394,280 B1 | 3/2013 | Wan et al. |
| 8,400,731 B1 | 3/2013 | Li et al. |
| 8,404,128 B1 | 3/2013 | Zhang et al. |
| 8,404,129 B1 | 3/2013 | Luo et al. |
| 8,405,930 B1 | 3/2013 | Li et al. |
| 8,409,453 B1 | 4/2013 | Jiang et al. |
| 8,413,317 B1 | 4/2013 | Wan et al. |
| 8,416,540 B1 | 4/2013 | Li et al. |
| 8,419,953 B1 | 4/2013 | Su et al. |
| 8,419,954 B1 | 4/2013 | Chen et al. |
| 8,422,176 B1 | 4/2013 | Leng et al. |
| 8,422,342 B1 | 4/2013 | Lee |
| 8,422,841 B1 | 4/2013 | Shi et al. |
| 8,424,192 B1 | 4/2013 | Yang et al. |
| 8,441,756 B1 | 5/2013 | Sun et al. |
| 8,443,510 B1 | 5/2013 | Shi et al. |
| 8,444,866 B1 | 5/2013 | Guan et al. |
| 8,449,948 B2 | 5/2013 | Medina et al. |
| 8,451,556 B1 | 5/2013 | Wang et al. |
| 8,451,563 B1 | 5/2013 | Zhang et al. |
| 8,454,846 B1 | 6/2013 | Zhou et al. |
| 8,455,119 B1 | 6/2013 | Jiang et al. |
| 8,456,961 B1 | 6/2013 | Wang et al. |
| 8,456,963 B1 | 6/2013 | Hu et al. |
| 8,456,964 B1 | 6/2013 | Yuan et al. |
| 8,456,966 B1 | 6/2013 | Shi et al. |
| 8,456,967 B1 | 6/2013 | Mallary |
| 8,458,892 B2 | 6/2013 | Si et al. |
| 8,462,592 B1 | 6/2013 | Wolf et al. |
| 8,468,682 B1 | 6/2013 | Zhang |
| 8,472,288 B1 | 6/2013 | Wolf et al. |
| 8,480,911 B1 | 7/2013 | Osugi et al. |
| 8,486,285 B2 | 7/2013 | Zhou et al. |
| 8,486,286 B1 | 7/2013 | Gao et al. |
| 8,488,272 B1 | 7/2013 | Tran et al. |
| 8,491,801 B1 | 7/2013 | Tanner et al. |
| 8,491,802 B1 | 7/2013 | Gao et al. |
| 8,493,693 B1 | 7/2013 | Zheng et al. |
| 8,493,695 B1 | 7/2013 | Kaiser et al. |
| 8,495,813 B1 | 7/2013 | Hu et al. |
| 8,498,084 B1 | 7/2013 | Leng et al. |
| 8,506,828 B1 | 8/2013 | Osugi et al. |
| 8,514,517 B1 | 8/2013 | Batra et al. |
| 8,518,279 B1 | 8/2013 | Wang et al. |
| 8,518,832 B1 | 8/2013 | Yang et al. |
| 8,520,336 B1 | 8/2013 | Liu et al. |
| 8,520,337 B1 | 8/2013 | Liu et al. |
| 8,524,068 B2 | 9/2013 | Medina et al. |
| 8,526,275 B1 | 9/2013 | Yuan et al. |
| 8,531,801 B1 | 9/2013 | Xiao et al. |
| 8,532,450 B1 | 9/2013 | Wang et al. |
| 8,533,937 B1 | 9/2013 | Wang et al. |
| 8,537,494 B1 | 9/2013 | Pan et al. |
| 8,537,495 B1 | 9/2013 | Luo et al. |
| 8,537,502 B1 | 9/2013 | Park et al. |
| 8,545,999 B1 | 10/2013 | Leng et al. |
| 8,547,659 B1 | 10/2013 | Bai et al. |
| 8,547,667 B1 | 10/2013 | Roy et al. |
| 8,547,730 B1 | 10/2013 | Shen et al. |
| 8,555,486 B1 | 10/2013 | Medina et al. |
| 8,559,141 B1 | 10/2013 | Pakala et al. |
| 8,563,146 B1 | 10/2013 | Zhang et al. |
| 8,565,049 B1 | 10/2013 | Tanner et al. |
| 8,576,517 B1 | 11/2013 | Tran et al. |
| 8,578,594 B2 | 11/2013 | Jiang et al. |
| 8,582,238 B1 | 11/2013 | Liu et al. |
| 8,582,241 B1 | 11/2013 | Yu et al. |
| 8,582,253 B1 | 11/2013 | Zheng et al. |
| 8,588,039 B1 | 11/2013 | Shi et al. |
| 8,593,914 B2 | 11/2013 | Wang et al. |
| 8,597,528 B1 | 12/2013 | Roy et al. |
| 8,599,520 B1 | 12/2013 | Liu et al. |
| 8,599,657 B1 | 12/2013 | Lee |
| 8,603,593 B1 | 12/2013 | Roy et al. |
| 8,607,438 B1 | 12/2013 | Gao et al. |
| 8,607,439 B1 | 12/2013 | Wang et al. |
| 8,611,035 B1 | 12/2013 | Bajikar et al. |
| 8,611,054 B1 | 12/2013 | Shang et al. |
| 8,611,055 B1 | 12/2013 | Pakala et al. |
| 8,614,864 B1 | 12/2013 | Hong et al. |
| 8,619,512 B1 | 12/2013 | Yuan et al. |
| 8,625,233 B1 | 1/2014 | Ji et al. |
| 8,625,941 B1 | 1/2014 | Shi et al. |
| 8,628,672 B1 | 1/2014 | Si et al. |
| 8,630,068 B1 | 1/2014 | Mauri et al. |
| 8,634,280 B1 | 1/2014 | Wang et al. |
| 8,638,529 B1 | 1/2014 | Leng et al. |
| 8,643,980 B1 | 2/2014 | Fowler et al. |
| 8,649,123 B1 | 2/2014 | Zhang et al. |
| 8,665,561 B1 | 3/2014 | Knutson et al. |
| 8,670,211 B1 | 3/2014 | Sun et al. |
| 8,670,213 B1 | 3/2014 | Zeng et al. |
| 8,670,214 B1 | 3/2014 | Knutson et al. |
| 8,670,294 B1 | 3/2014 | Shi et al. |
| 8,670,295 B1 | 3/2014 | Hu et al. |
| 8,675,318 B1 | 3/2014 | Ho et al. |
| 8,675,455 B1 | 3/2014 | Krichevsky et al. |
| 8,681,594 B1 | 3/2014 | Shi et al. |
| 8,689,430 B1 | 4/2014 | Chen et al. |
| 8,693,141 B1 | 4/2014 | Elliott et al. |
| 8,703,397 B1 | 4/2014 | Zeng et al. |
| 8,705,205 B1 | 4/2014 | Li et al. |
| 8,711,518 B1 | 4/2014 | Zeng et al. |
| 8,711,528 B1 | 4/2014 | Xiao et al. |
| 8,717,709 B1 | 5/2014 | Shi et al. |
| 8,720,044 B1 | 5/2014 | Tran et al. |
| 8,721,902 B1 | 5/2014 | Wang et al. |
| 8,724,259 B1 | 5/2014 | Liu et al. |
| 8,749,790 B1 | 6/2014 | Tanner et al. |
| 8,749,920 B1 | 6/2014 | Knutson et al. |
| 8,753,903 B1 | 6/2014 | Tanner et al. |
| 8,760,807 B1 | 6/2014 | Zhang et al. |
| 8,760,818 B1 | 6/2014 | Diao et al. |
| 8,760,819 B1 | 6/2014 | Liu et al. |
| 8,760,822 B1 | 6/2014 | Li et al. |
| 8,760,823 B1 | 6/2014 | Chen et al. |
| 8,763,235 B1 | 7/2014 | Wang et al. |
| 8,780,498 B1 | 7/2014 | Jiang et al. |
| 8,780,505 B1 | 7/2014 | Xiao |
| 8,786,983 B1 | 7/2014 | Liu et al. |
| 8,790,524 B1 | 7/2014 | Luo et al. |
| 8,790,527 B1 | 7/2014 | Luo et al. |
| 8,792,208 B1 | 7/2014 | Liu et al. |
| 8,792,312 B1 | 7/2014 | Wang et al. |
| 8,793,866 B1 | 8/2014 | Zhang et al. |
| 8,797,680 B1 | 8/2014 | Luo et al. |
| 8,797,684 B1 | 8/2014 | Tran et al. |
| 8,797,686 B1 | 8/2014 | Bai et al. |
| 8,797,692 B1 | 8/2014 | Guo et al. |
| 8,813,324 B2 | 8/2014 | Emley et al. |
| 2004/0009295 A1 | 1/2004 | Kobayashi et al. |
| 2004/0076749 A1 | 4/2004 | Lee et al. |
| 2007/0281248 A1* | 12/2007 | Levinson et al. ............ 430/311 |
| 2010/0290157 A1 | 11/2010 | Zhang et al. |
| 2011/0086240 A1 | 4/2011 | Xiang et al. |
| 2011/0129781 A1 | 6/2011 | Kim et al. |
| 2012/0029269 A1 | 2/2012 | Burton et al. |
| 2012/0111826 A1 | 5/2012 | Chen et al. |
| 2012/0196211 A1 | 8/2012 | Masunaga et al. |
| 2012/0208127 A1 | 8/2012 | Hatakeyama |
| 2012/0216378 A1 | 8/2012 | Emley et al. |
| 2012/0237878 A1 | 9/2012 | Zeng et al. |
| 2012/0298621 A1 | 11/2012 | Gao |
| 2013/0216702 A1 | 8/2013 | Kaiser et al. |
| 2013/0216863 A1 | 8/2013 | Li et al. |

(56) References Cited

U.S. PATENT DOCUMENTS

| | | |
|---|---|---|
| 2013/0257421 A1 | 10/2013 | Shang et al. |
| 2014/0154529 A1 | 6/2014 | Yang et al. |
| 2014/0175050 A1 | 6/2014 | Zhang et al. |

OTHER PUBLICATIONS

Shin-Etsu MicroSi, "SEPR-1051 NiFe Sputtered Substrate," http://www.microsi.com/user/document/SEPR_I051_Ni_Fe.pdf, downloaded on Oct. 27, 2014, pp. 1-16.

Na Zhang, "Literature Research Report for Lift-Off Method", BME 390A term project, accessed at http://www.vanderbilt.edu/viibre/documents/Zhang_lift-off.doc, Sep. 2006, 28 pages.

"LOR and PMGI Resists," datasheet downloaded from MicroChem.com website on Nov. 12, 2007, http://www.microchem.com/products/pdf/PMGI-Resists-data-sheetV-rhcedit-102206.pdf, 7 pages.

"NANO PMGI Resists," document downloaded from MicroChem.com website on Nov. 12, 2007, http://www.microchem.com, 6 pages.

Matsumoto, et al., "Thermally Assisted Magnetic Recording," Fujitsu Sci. Tech. J., vol. 42, No. 1, pp. 158-167, Jan. 2006.

\* cited by examiner

US 9,104,107 B1

DUV PHOTORESIST PROCESS

CROSS-REFERENCE TO RELATED APPLICATION

This application claims priority to U.S. Provisional Patent Application No. 61/808,160 entitled "Post Exposure Bake Removal for DUV Photoresist Process" filed on Apr. 3, 2013 for Xianzhong Zeng, et al. which is incorporated herein by reference.

BACKGROUND

FIG. 1 illustrates a conventional process 100 for preparing a photoresist. In process 100 a photoresist is provided on a substrate to form a coating in block 12, and then the photoresist coating is soft baked via block 14. Exposure of the coating through a mask is then performed via block 16. Process 100 proceeds to bake the resist coating after exposure via block 18, a procedure known as post exposure bake. A post exposure bake procedure is considered necessary to forman image in the resist. The conventional process concludes with development block 19, in which the pattern on the mask is transferred to the resist coating.

Features patterned with photoresist masks prepared in accordance with process 100 have demonstrated deformed sidewalls in certain photolithography processes. FIG. 2A depicts a photoresist 30 on substrate 32. Photoresist 30 has been baked after exposure in accordance with the method of FIG. 1. As a result of performing a post exposure bake, the top and bottom resist critical dimension (CD) shrink to form the curved side walls 35 of FIG. 2A. After development, sidewall 35 of photoresist 30 has a deformed profile that deviates from the substantially vertical sidewalls that are desirable for fabricating microelectronic structures. Thus, process 100 generates photoresists that are unsuitable for forming microelectronic structures with predetermined critical dimensions.

A photoresist processed in accordance with the method of FIG. 1 was used to define the side shields 20 of FIG. 2B. On substrate 22, side shields 20 are shown flanking cavity 25 in an intermediate structure. Intermediate structure may be used to fabricate, for example, a magnetic recording head. Cavity 25 has a narrower opening f near top 23, and a much wider opening g near base 28. Specifically, FIG. 2B illustrates an intermediate structure having a width f near the top 23 of cavity 25 and a width g near base 28 of cavity 25. Since width f is significantly dissimilar to width g, the sidewall profile of features patterned with photoresists prepared by process 100 adversely impacts the critical dimensions of patterned devices.

It is believed that post exposure baking can deform photoresist sidewalls prepared in accordance with process 100. Therefore, photoresists prepared in accordance with process 100 impartan undesirable curvature to side shields 20 in FIG. 2B.

In light of the aforementioned problems, there is a need for improving the methods for processing photoresists for high resolution lithography.

DETAILED DESCRIPTION

Several embodiments of the invention will be described in reference to FIGS. 3-6. The figures are not drawn to the scale of an actual device or system, and are merely illustrative of the embodiments described herein.

Figure 3:
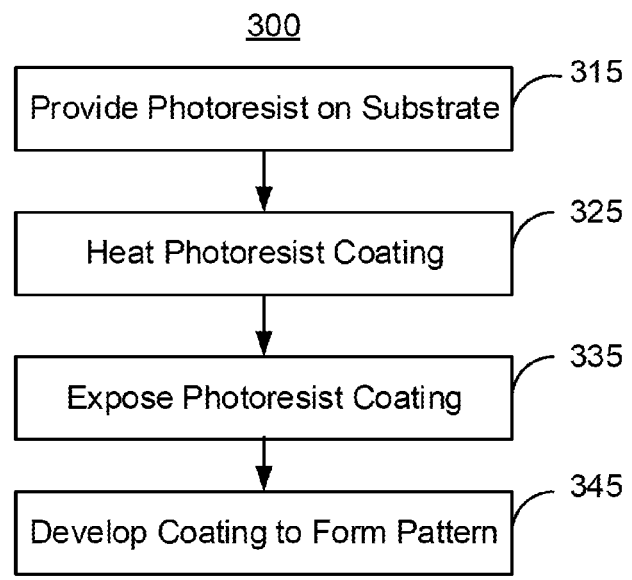
FIG. 3 is a flowchart of a method for processing a photoresist in accordance with one embodiment of the disclosure.

One embodiment of the invention is directed to forming a pattern in a deep ultraviolet (DUV) lithography process. The flowchart of FIG. 3 summarizes a process 300 of an embodiment of the disclosure. Process 300 begins at block 315 in which a thick photoresist is placed on a substrate to form a coating. Then the coating is soft baked or heated in block 325 to remove residual solvent. After soft baking, the coating can have a thickness of about 0.25 to about 5 micrometers in some embodiments. In other embodiments, the coating will have a thickness of about 1 to about 3 micrometers after block 325.

Following the process of FIG. 3, the photoresist is then exposed via block 335. After exposure, the photoresist is developed in accordance with block 345, without any intervening baking performed between the exposure and development blocks. In certain embodiments, by adopting the process of FIG. 3, approximately 10-20% of processing time can be saved.

The process of FIG. 3 may be implemented in several different ways. In one embodiment, a resist is coated onto a substrate in block 315. Then the resist is baked as shown in block 325. Thereafter, the resist is exposed at a high dosage in block 335. During exposure, a ranging dosage ranged from 160-200 mJ/cm$^2$ is provided by a laser to expose portions of the positive photoresist. Since the resist can be irradiated with wavelengths of less than 300 nm, suitable light sources encompass DUV with wavelengths of 248 nm. Specifically, the light source may be a laser such as a krypton fluoride laser. After exposure, the resist is developed in block 345. In this embodiment, post exposure baking is not performed. Following development, the exposed regions of the resist are removed in block 345. Acid diffusion of the photoresist may occur at room temperature. Despite the absence of post exposure baking from the process of FIG. 3, the contrast and sensitivity of the resulting photoresists was acceptable. It is believed that a combination of a high dosage exposure and omission of post exposure baking forms smooth patterned features in certain embodiments.

Yet another embodiment of FIG. 3 is directed to forming a patterned feature in a DUV lithography process. This embodiment comprises providing a photoresist on a substrate; heating the photoresist prior to exposure; exposing a portion of the photoresist to an illumination dose greater than or equal to 160 mJ/cm$^2$; and then developing the photoresist to form a pattern. In this embodiment, a post exposure bake (PEB) prior to block 245 is not performed.

Figure 4A:
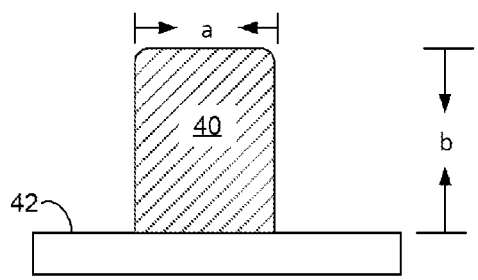
FIG. 4A depicts a photoresist produced in accordance with the process of FIG. 3.

FIG. 4A illustrates a photoresist 40, on substrate 42, produced in accordance with one embodiment of the process of FIG. 3. When processed in accordance with this embodiment, a substantially straight sidewall profile 35 for photoresist 40 is obtained. By removing PEB in the process flow and/or controlling exposure, substantially straight photoresist side walls 35 were obtained, as shown in FIG. 4A.

In certain embodiments, the photoresist is a positive photoresist. A suitable photoresist is Shinetsu I051, available from Shin-etsu, MicroSi, Inc. Although, in certain embodiments a positive photoresist is used, other embodiments of the process could employ a negative photoresist instead.

The positive photoresist is a combination of a suitable polymer with a photoactive compound (PAC). The PAC absorbs light energy during block 335, resulting in the generation of an acid. The acid reacts with the polymer to break some of the polymeric bonds. In certain embodiments, the absence of PEB does not preclude PAC from absorbing sufficient amount of light energy to cleave chemical groups from the polymer. Thus chemical amplification occurs in the deep UV process in some embodiments of the present disclosure. The exposed photoresist film is developed with a basic chemical developer in block 345 to transfer the pattern from a mask to the photoresist.

Figure 1:
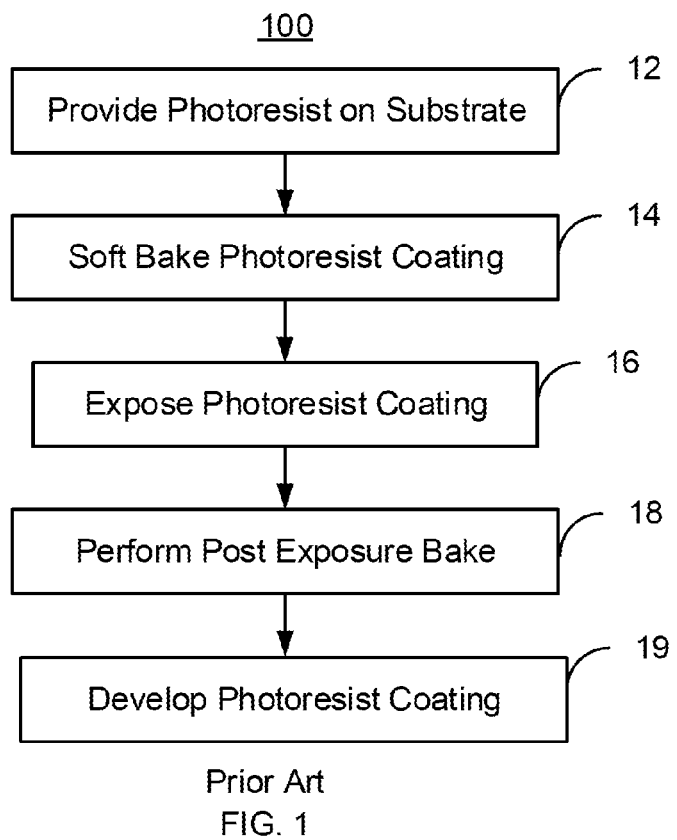
FIG. 1 is a flowchart of a conventional method for producing a photoresist.
Figure 2A:
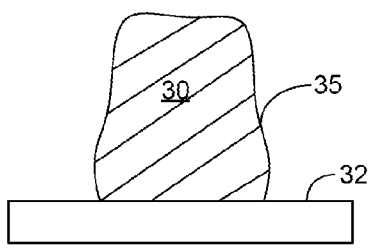
FIG. 2A depicts a photoresist produced in accordance with the prior method of FIG. 1.
Figure 2B:
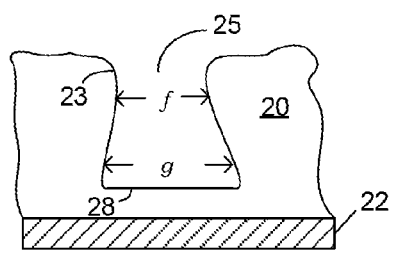
FIG. 2B depicts a side shield produced in accordance with the prior method of FIG. 1.
Figure 4B:
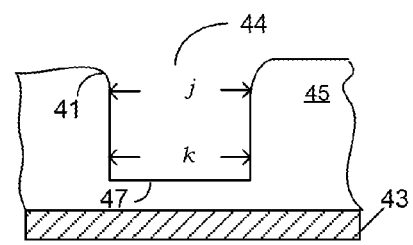
FIG. 4B depicts a side shield produced with a photoresist processed in accordance with an embodiment of the method of FIG. 3.

FIG. 4B depicts a structure such as a side shield 45 on a substrate 43 that is patterned with a photoresist produced in accordance with an embodiment of FIG. 3. FIG. 4B illustrates side shields 45 in an intermediate structure that may be used to fabricate a magnetic recording head. Side shields 45 flank cavity 44. Cavity 44 has an upper portion 41 with a width j and a lower portion 47 with a width k. Width j of cavity 44 substantially equals width k of cavity 44. The consistent widths for cavity 44 are an improvement over the side shield profile obtained in FIG. 2B. Thus, by using a photoresist processed in accordance with embodiments of the disclosure, substantially straight side shields 45 may be obtained.

Figure 5:
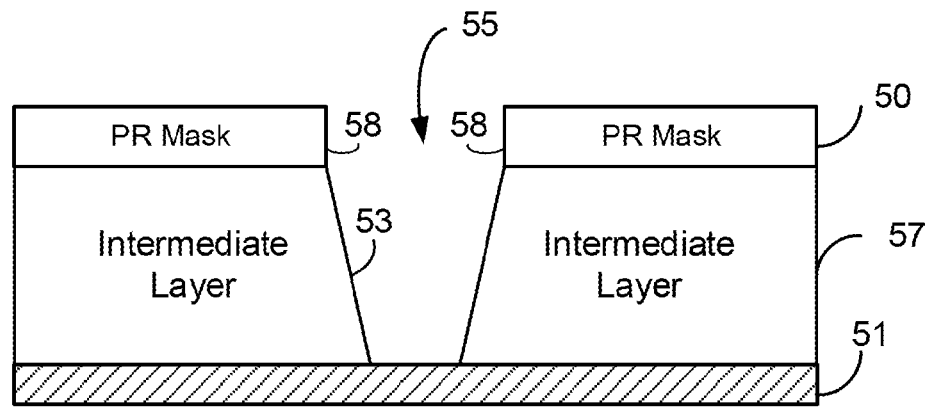
FIG. 5 illustrates a trench formed using a photoresist mask prepared in accordance with an embodiment of the method of FIG. 3.

Features patterned with a photoresist 50 produced in accordance with FIG. 3 will now be discussed in association with FIG. 5. After forming a photoresist 50 with straight side walls 58 in accordance with an embodiment of the disclosure, further processing can be performed. For example, FIG. 5 illustrates a trench 55 patterned in intermediate layer 57 using photoresist 50 as a mask. The resulting trench 55 is produced with a smooth sidewall profile 53.

Figure 6A:
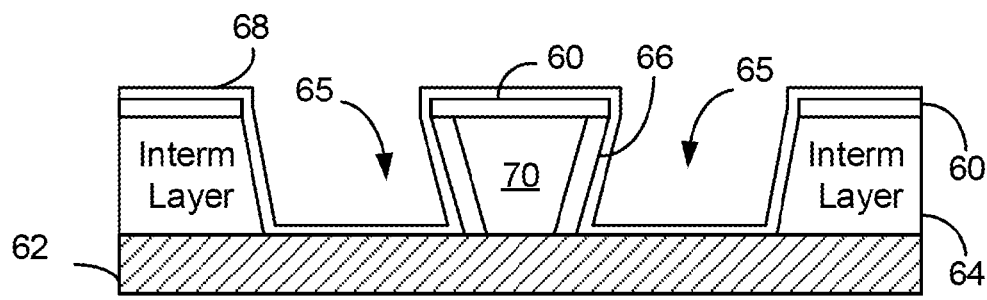
FIGS. 6A-6B illustrate a sequence of figures representing a process for forming a side shield in accordance with another embodiment of the disclosure.
Figure 6B:
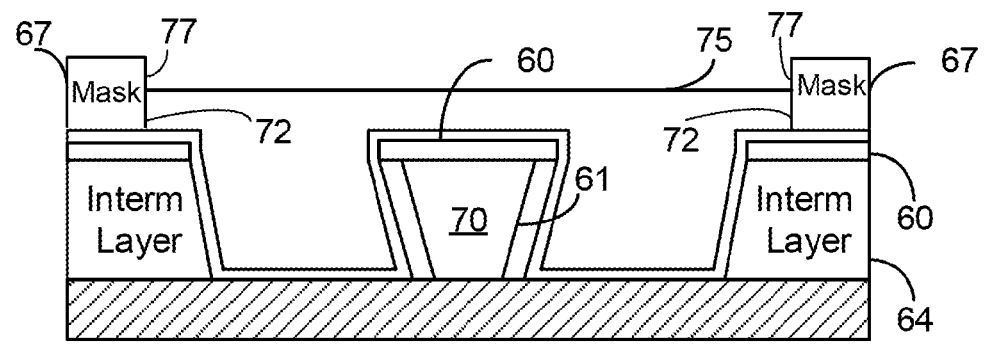

Yet another example of patterning with a photoresist produced in accordance with an embodiment of FIG. 3 is shown in FIGS. 6A and 6B, where common elements have been omitted from for clarity. FIG. 6A illustrates an intermediate structure that includes a write pole 70 that has been ion milled and planarized to a predetermined width. Layer 66 is provided adjacent to sidewalls 61 of write pole 70 to separate pole 70 from intermediate layer (interm layer) 64. On an upper surface of intermediate layer 64 and write pole 70 lies a remnant of mask 60 which was used to define write pole 70. Seed layer 68 can be deposited across the structure of FIG. 6A in preparation for depositing shield material in a manner that is known to the skilled artisan. The deposition of seed layer 68 creates channels 65.

After the structure in FIG. 6A is formed, a photoresist mask 67, prepared in accordance with an embodiment of FIG. 3, is disposed on seed layer 68. FIG. 6B illustrates the substantially straight side walls 77 of photoresist mask 67. Photoresist mask 67 is used to define side shield 75 when side shield material is deposited onto seed layer 68 to extend within channels 65. Due to the substantially straight profile of photoresist mask 67, side shields 75 are formed with substantially straight side walls 72.

Example 1

A solution of Shinetsu I051 was spun onto a wafer, and then heated at 110° C. After baking, the photoresist had a thickness of between about 1-4 microns. Using an ArF laser, the resist coating was exposed at a wavelength of 248 nm and an energy of 170 mJ/cm$^2$. Then, the coating was developed to completely transfer the pattern from the mask to the substrate. A PEB was not performed prior to development.

The above detailed description is provided to enable any person skilled in the art to practice the various embodiments described herein. While several embodiments have been described, it should be understood that these are for illustration purposes only and should not be taken as limiting the scope of the invention.

Various modifications to these embodiments will be readily apparent to those skilled in the art, and generic principles defined herein may be applied to other embodiments. Thus, many changes and modifications may be made to the embodiments, by one having ordinary skill in the art, without departing from the spirit and scope of the invention.

We claim:

1. A method of forming a pattern in a DUV lithography process, the method comprising:
    providing a photoresist on a substrate to form a coating;
    heating the coating prior to exposure;
    exposing a portion of the coating at a wavelength between 248 nm and 300 nm while irradiating the coating at a dosage from 160 mJ/cm$^2$ to 200 mJ/cm$^2$, inclusive; and
    developing the coating to form a pattern, without performing a post exposure bake prior to developing the coating.

2. The method of claim 1, wherein the coating has a thickness of about 0.25 micrometers to about 5 micrometers after the coating is heated.

3. The method of claim 1, wherein the coating has a thickness of about 1 micrometers to about 3 micrometers after the coating is heated.

4. The method of claim 1, wherein the coating remaining after development comprises a structure having substantially straight sidewalls.

5. The method of claim 1, wherein the coating is exposed at a wavelength of 248 nm.

6. The method of claim 1, wherein the exposing a portion of the coating further comprises irradiating the coating with either a krypton fluoride laser or an argon fluoride laser.

7. A method of forming a pattern in a DUV lithography process, the method comprising:
    providing a photoresist on a substrate to form a coating;
    heating the coating prior to exposure;
    exposing a portion of the coating to an illumination dose from 160 mJ/cm$^2$ to 200 mJ/cm$^2$, inclusive; and
    developing the coating to form a pattern, without performing a post exposure bake prior to developing the coating.

8. The method of claim 7, wherein the coating has a thickness of about 0.25 micrometers to about 5 micrometers after the coating is heated.

9. The method of claim 7, wherein the coating has a thickness of about 1 micrometers to about 3 micrometers after the coating is heated.

10. The method of claim 7, wherein the coating remaining after development comprises a structure having substantially straight sidewalls.

11. The method of claim 7, wherein the coating is exposed with either a krypton fluoride laser or an argon fluoride laser.

12. A method of forming a pattern in a DUV lithography process, the method comprising:
    providing a chemically-amplified photoresist on a substrate to form a coating;
    heating the coating prior to exposure;

exposing a portion of the coating at a wavelength between 248 nm and 300 nm while irradiating the coating with an illumination dose from 160 mJ/cm$^2$ to 200 mJ/cm$^2$, inclusive; and developing the coating to form a pattern, without performing a post exposure bake prior to developing the coating.

13. The method of claim 12, wherein the coating has a thickness of about 0.25 micrometers to about 5 micrometers after the coating is heated.

14. The method of claim 12, wherein the coating has a thickness of about 1 micrometers to about 3 micrometers after the coating is heated.

15. The method of claim 12, wherein the coating remaining after development comprises a structure having substantially straight sidewalls.

16. The method of claim 12, wherein the coating is exposed at a wavelength of 248 nm.

17. The method of claim 12, wherein the coating is exposed with a krypton fluoride laser or an argon fluoride laser.

18. The method of claim 12, wherein the chemically-amplified photoresist is catalyzed with an acid.

\* \* \* \* \*